(12) United States Patent
Reboud et al.

(10) Patent No.: US 10,666,019 B2
(45) Date of Patent: May 26, 2020

(54) SEMICONDUCTOR STRUCTURE INCLUDING A SUSPENDED MEMBRANE CONTAINING A CENTRAL SEGMENT OF STRUCTURED THICKNESS

(71) Applicant: Commissariat a l'energie atomique et aux energies alternatives, Paris (FR)

(72) Inventors: Vincent Reboud, Paris (FR); Alban Gassenq, Saint-Hilaire (FR); Samuel Tardif, Grenoble (FR); Vincent Calvo, Fontaine (FR); Alexei Tchelnokov, Meylan (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 7 days.

(21) Appl. No.: 16/053,093

(22) Filed: Aug. 2, 2018

(65) Prior Publication Data
US 2019/0044308 A1   Feb. 7, 2019

(30) Foreign Application Priority Data
Aug. 3, 2017   (FR) ...................................... 17 57484

(51) Int. Cl.
*H01S 5/34* (2006.01)
*H01S 5/10* (2006.01)
(Continued)

(52) U.S. Cl.
CPC .......... *H01S 5/3427* (2013.01); *B81B 3/0086* (2013.01); *B81C 1/00158* (2013.01); *H01S 5/1071* (2013.01); *H01S 5/3027* (2013.01); *B81B 2203/0127* (2013.01); *H01S 5/30* (2013.01)

(58) Field of Classification Search
CPC .... H01S 5/3427; H01S 5/1071; H01S 5/3027; H01S 5/30; B81B 2203/0127; B81B 3/0086; B81C 1/00158
See application file for complete search history.

(56) References Cited

U.S. PATENT DOCUMENTS

| | | | |
|---|---|---|---|
| 2010/0207254 A1* | 8/2010 | Jain | ........................ H01L 31/105<br>257/629 |
| 2015/0102465 A1* | 4/2015 | Chen | ................... H01L 21/3065<br>257/616 |

(Continued)

OTHER PUBLICATIONS

French Preliminary Search Report dated Apr. 17, 2018 in French Application 17 57484 filed on Aug. 3, 2017 (with English Translation of Categories of Cited Documents and Written Opinion).

(Continued)

*Primary Examiner* — Yuanda Zhang
(74) *Attorney, Agent, or Firm* — Oblon, McClelland, Maier & Neustadt, L.L.P.

(57) ABSTRACT

A semiconductor structure including a semiconductor layer made of a crystalline semiconductor compound, a portion of the semiconductor layer which forms a suspended membrane above a carrier layer, the suspended membrane being formed from a tensilely stressed central segment and a plurality of lateral segments forming tensioning arms. The central segment includes at least one zone of thinned thickness.

13 Claims, 6 Drawing Sheets

(51) Int. Cl.
    *H01S 5/30*     (2006.01)
    *B81C 1/00*     (2006.01)
    *B81B 3/00*     (2006.01)

(56) References Cited

U.S. PATENT DOCUMENTS

| | | | |
|---|---|---|---|
| 2015/0372454 A1* | 12/2015 | Guilloy | H01S 5/105 |
| | | | 372/45.01 |
| 2017/0092809 A1* | 3/2017 | Reboud | H01L 21/02381 |
| 2017/0093130 A1* | 3/2017 | Gassenq | H01S 5/3223 |
| 2018/0162724 A1* | 6/2018 | Tripathi | G02B 26/0833 |

OTHER PUBLICATIONS

V. Reboud, et al., "Ultra-high amplified strain on 200 mm optical Germanium-On-Insulator (GeOI) substrates: towards CMOS compatible Ge lasers," Proc. of SPIE, vol. 9752, 2016, pp. 97520F-1-97520F-8.

A. Gassenq, et al., "1.9% bi-axial tensile strain in thick germanium suspended membranes fabricated in optical germanium-on-insulator substrates for laser applications," Applied Physics Letters 107, 2015, pp. 191904-1-191904-4.

D. Burt, et al., "Strain-Engineering in Germanium Membranes towards Light Sources on Silicon," IEEE Electron Devices Technology and Manufacturing Conference Proceedings of Technical Papers, 2017, pp. 92-94.

M. J. Suess, et al., "Analysis of enhanced light emission from highly strained germanium microbridges," Nature Photonics, vol. 7, Jun. 2013, pp. 466-472.

* cited by examiner

SEMICONDUCTOR STRUCTURE INCLUDING A SUSPENDED MEMBRANE CONTAINING A CENTRAL SEGMENT OF STRUCTURED THICKNESS

TECHNICAL FIELD

The field of the invention is that of semiconductor structures made of a crystalline semiconductor compound, and including a suspended membrane a central segment of which is placed under tension by tensioning arms. The invention in particular applies to microelectronic or optoelectronic devices including such a semiconductor structure.

PRIOR ART

In various microelectronic or optoelectronic applications, it may be advantageous to use a layer made of a crystalline, and preferably monocrystalline, semiconductor compound having a tensile mechanical stress. This is in particular the case of certain light sources the material of the emitting layer of which has, unstressed, an indirect energy-band structure, the band structure then being made direct by applying a sufficient tensile stress. The crystalline semiconductor compound may be a compound based on germanium, for example germanium, germanium-tin, or even silicon-germanium.

Document EP2960203 describes an example of a semiconductor structure including a germanium-based semiconductor layer, the semiconductor layer being structured to form a suspended membrane above a carrier layer. The suspended membrane includes a central segment that is placed under tension by lateral segments that form tensioning arms. The latter have a trapezoidal shape the width of which increases with distance from the central segment, thus allowing the uniformity of the spatial distribution of the mechanical stresses experienced by the central segment to be improved.

There is however a need to provide a suspended-membrane semiconductor structure made of a crystalline semiconductor compound that has improved optical and/or electronic properties.

SUMMARY OF THE INVENTION

The objective of the invention is to at least partially remedy the drawbacks of the prior art, and more particularly to provide a semiconductor structure including a suspended membrane made of a crystalline semiconductor compound that has improved optical and/or electronic properties.

To this end, one subject of the invention is a semiconductor structure, including a semiconductor layer made of a crystalline semiconductor compound, a portion of the semiconductor layer of which forms a suspended membrane above a carrier layer, the suspended membrane comprising: a central segment that is tensilely stressed in a plane parallel to the carrier layer; and a plurality of lateral segments that are opposite one another with respect to the central segment and arranged so as to keep the central segment suspended and tensilely stressed along at least two separate deformation axes, the lateral segments having an average width larger than an average width of the central segment. The average width being an average dimension, in a plane parallel to the plane of the carrier layer along an axis that is transverse to said deformation axes. According to the invention, the central segment includes at least one zone of thinned thickness.

The following are certain preferred, nonlimiting aspects of this semiconductor structure.

The thickness of the thinned zone may be thinned by 20% or more, and preferably 50% or more.

A ratio between the area of the thinned zone and the area of the central segment may be higher than or equal to 14%, and preferably higher than or equal to 25%.

The suspended membrane may have a direct energy-band structure at least in said thinned zone.

The crystalline semiconductor compound may be based on germanium.

The central segment may include a plurality of thinned zones that are separate from one another and arranged, with respect to one another, so as to form an optical cavity.

The invention also relates to an optoelectronic device for emitting coherent light, including a semiconductor structure according to the preceding feature, the central segment being suitable for forming a gain medium of the optoelectronic device.

The central segment may include a plurality of thinned zones that are separate from one another and placed beside one another periodically so as to form photonic crystals.

The central segment may include a first thinned zone encircled by a plurality of thinned zones that are separate from one another and that each have a ring shape encircling the first thinned zone, so as to form a ringed optical cavity.

The central segment may include at least two thinned zones taking the form of strips that are parallel to one another and that extend longitudinally over the central segment and over two lateral segments that are placed opposite each other with respect to the central segment. Bragg mirrors may be located at the ends of the thinned zones in order to form an optical cavity.

The invention also relates to a process for fabricating a semiconductor structure according to any one of the preceding features, including the following steps:
i) producing a stack comprising the semiconductor layer covering a sacrificial layer that is placed on a carrier layer, the semiconductor layer having an initial non-zero tensile-stress value;
ii) structuring the semiconductor layer so as to form the structured portion and the peripheral portion;
iii) producing at least one zone of thinned thickness in the central segment; and
iv) producing a cavity under the structured portion and thereby freeing a surface of the carrier layer located facing the structured portion, the central segment then being tensilely stressed with a final value higher than the initial value.

The fabricating process may include at least the following steps:
prior to step i of producing the stack, estimating a minimum tensile-stress value from which the thinned zone of the central segment has a direct energy-band structure for a given value of average thickness of the thinned zone;
in step i, producing the stack so that the semiconductor layer has an initial value lower than the minimum value; and
prior to the structuring step ii, defining the structuring so that, after step iv of producing the cavity, the thinned zone of the central section has a final tensile-stress value higher than or equal to the minimum value, and therefore a direct energy-band structure.

BRIEF DESCRIPTION OF THE DRAWINGS

Other aspects, aims, advantages and features of the invention will become more clearly apparent on reading the following detailed description of preferred embodiments thereof, which description is given by way of nonlimiting example with reference to the appended drawings, in which.

DETAILED DESCRIPTION OF PARTICULAR EMBODIMENTS

In the figures and in the rest of the description, elements that are identical or similar have been referenced with the same references. In addition, the various elements are not shown to scale for the sake of the clarity of the figures. Moreover, the various embodiments and variants are not exclusive from one another and may be combined together. Unless otherwise indicated, the terms "substantially", "about", and "of the order of" mean to within 10%. Moreover, the expression "including a" must be understood to mean "including at least one", unless otherwise indicated.

Generally, the invention relates to a semiconductor structure including a suspended membrane made of a crystalline semiconductor compound, the suspended membrane including a central segment that is placed under tension by lateral segments forming tensioning arms. The suspended membrane is preferably based on germanium that is sufficiently tensilely stressed that the central segment has, at least partially, a direct energy-band structure.

Generally, the crystalline semiconductor compound is preferably a monocrystalline compound, and may in particular be chosen from elements of column IV of the periodic table of the elements, such as silicon, germanium, tin in its semiconductor phase, and alloys formed from these elements, for example SiGe, GeSn, SiGeSn, etc. It may also be chosen from alloys including elements of columns III and V of the periodic table of the elements, for example GaInAs and InP, or even including elements from columns II and VI, for example CdHgTe.

By stressed segment, what is meant is a layer segment made of a crystalline semiconductor compound having a compressive or tensile mechanical stress that leads to a deformation of the cells of the crystal lattice of the semiconductor compound. The segment is tensilely stressed when it experiences a mechanical stress that tends to stretch the cells of the lattice in a plane. In the context of the invention, the central segment of the semiconductor layer is tensilely stressed in the plane of the layer, this meaning that its lattice parameter has what is called an actual value higher than what is called its natural value when the semiconductor compound is relaxed i.e. unstressed. In the rest of the description, unless otherwise indicated, the stress in question is oriented in the plane of the semiconductor layer.

By direct or substantially direct band structure, what is meant is that the minimum energy $E_{BC,L}$ of the conduction band of the L valley (or indirect valley) is higher or substantially equal to the minimum energy $E_{BC,\Gamma}$ of the conduction band of the $\Gamma$ valley (or direct valley); in other words: $\Delta E = E_{BC,L} - E_{BC,\Gamma} \geq 0$. By substantially equal, what is meant here is that this energy difference is of the same order of magnitude or lower than kT, where k is Boltzmann's constant and T the temperature of the material. Preferably, the semiconductor layer is based on germanium the energy-band structure of which is indirect outside of the central segment of the suspended membrane, in other words $\Delta E < 0$. The tensile deformation of the central segment is sufficient to make its energy-band structure at least partially direct.

Figure 1A:
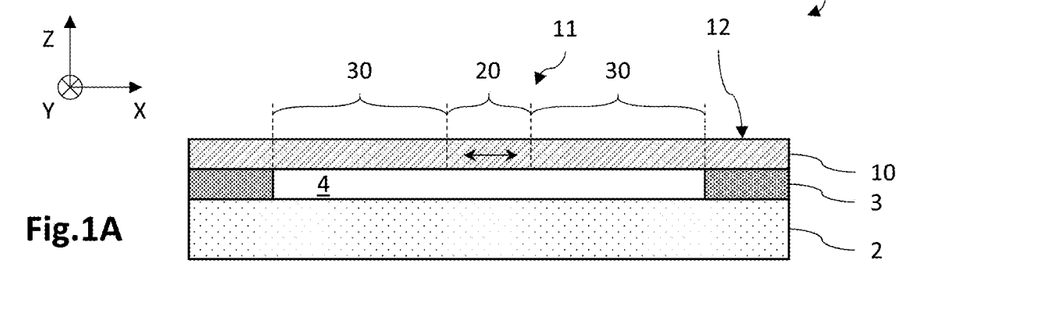
FIG. 1A is a schematic partial longitudinal cross-sectional view of a semiconductor structure according to an example of the prior art, including a suspended membrane containing a central segment that is tensilely stressed biaxially by tensioning arms.
Figure 1B:
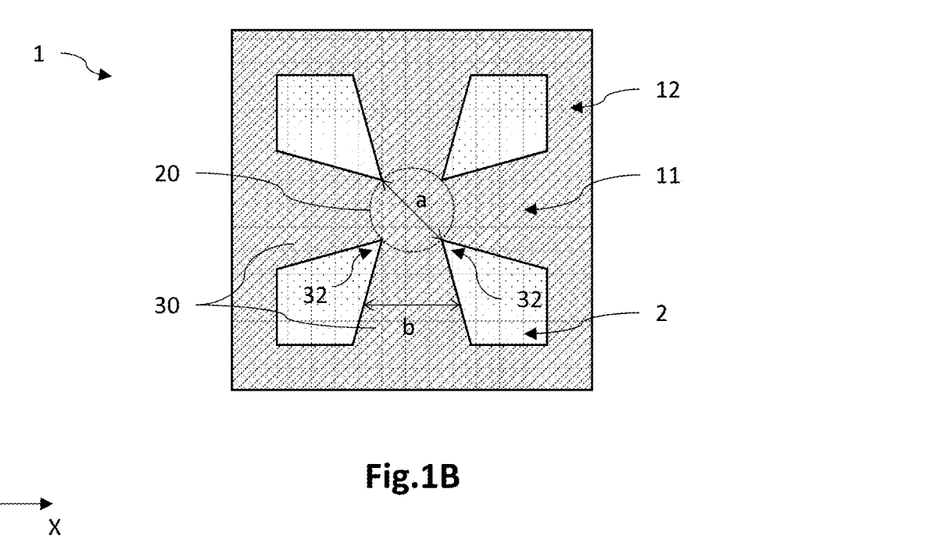
FIG. 1B is a schematic top view of the semiconductor structure illustrated in FIG. 1A.
Figure 1C:
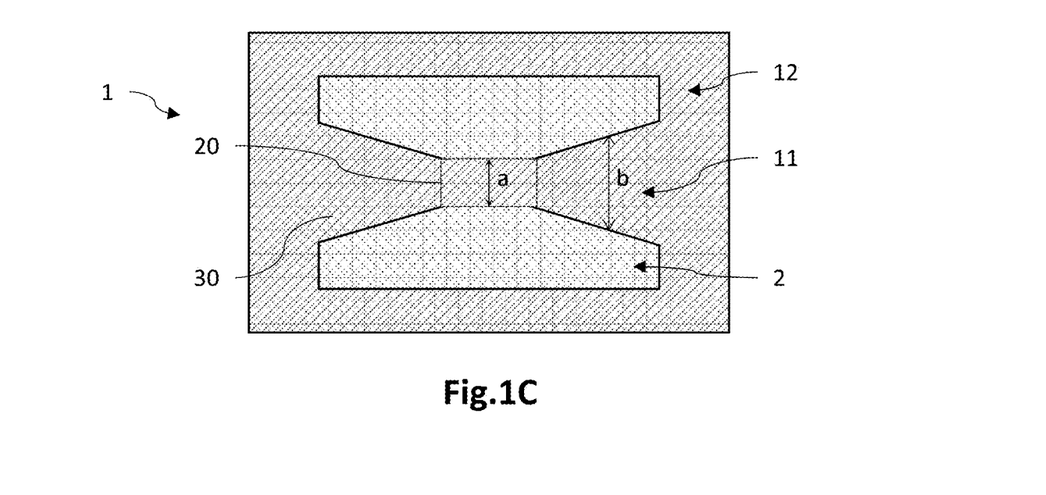
FIG. 1C is a schematic top view of a variant of the semiconductor structure illustrated in FIG. 1B, in which the central segment is tensilely stressed uniaxially.

FIGS. 1A and 1B are schematic partial views, respectively in longitudinal cross section and from above, of a suspended-membrane semiconductor structure 1 according to a prior-art example in which the central segment 20 experiences a biaxial tensile deformation. FIG. 1C illustrates a variant semiconductor structure 1 in which the tensile deformation of the central segment 20 is uniaxial.

A three-dimensional direct coordinate system (X, Y, Z), in which the axes X and Y form a plane parallel to the plane of a carrier layer 2, and in which the axis Z is oriented parallel to the thickness of the layers, is defined here and will be referred to throughout the description. In the rest of the description, the terms "lower" and "upper" will be understood as being relative to a position that increases with distance from the carrier layer 2 in the +Z direction.

The semiconductor structure 1 includes a stack comprising a carrier layer 2, a sacrificial layer 3 and a semiconductor layer to made of a preferably monocrystalline semiconductor compound. The carrier layer 2 may be made of a material chosen from silicon, sapphire, borosilicate, silica, glass, quartz, or any other suitable material. The sacrificial layer 3 may be made of a material chosen from an oxide or nitride of silicon, inter alia.

The semiconductor layer to comprises a structured portion 11 that is suspended above the carrier layer 2 and a peripheral portion 12 that encircles the structured portion 11. The peripheral portion 12 rests on the sacrificial layer 3, the latter containing a cavity 4 that is located under the structured portion 11. The structured portion 11 includes a central segment 20 that is connected to the peripheral portion 12 by lateral segments 30 that form tensioning arms 30. As FIGS. 1B and 1C show, the central segment 20 may have, in the (X, Y) plane, a substantially square or rectangular shape, of side length of a few tens of nanometres to a few microns, or even a circular or polygonal shape. The semiconductor layer 10 may have, depending on the targeted optoelectronic or electronic applications, a thickness of the order of a few tens of nanometres to a few microns or more. The sacrificial layer 3 may have a thickness of the order of a few tens of nanometres to a few microns. The carrier layer 2 may have a thickness of a few tens of nanometres to a few hundred microns.

At least two lateral segments 30 are produced that each connect a border of the central segment 20 to the peripheral portion 12. They are arranged in pairs facing the central segment 20 in order to define at least one substantially rectilinear deformation axis. In the example of FIG. 1B, two pairs of lateral segments 30 are shown, said lateral segments each extending from a border of the central segment 20 to the peripheral portion 12. The lateral segments 30 are arranged in pairs so as to define, here, two deformation axes, here parallel to the X and Y axes, respectively, said axes intersecting each other in the central segment 20. Thus, the central segment 20 experiences a biaxial tensile deformation along the two deformation axes. In the example of FIG. 1C, a single pair of lateral segments 30 is shown, the latter being arranged so as to define a single deformation axis of the central segment 20, here parallel to the axis X. The central segment 20 of the suspended membrane then experiences a uniaxial deformation.

The central segment 20 is a segment that is stressed, here tensilely, and the crystal structure of which is therefore deformed such as to increase its natural lattice parameter. The lateral segments 30 allow the initial tensile-stress value in the central segment 20 to be increased, preferably without however themselves experiencing a significant mechanical stress. They thus form tensioning arms 30. To this end, the tensioning arms 30 and the central segment 20 are dimensioned so that the average width "b" of the tensioning arms 30 is larger than the average width "a" of the central segment 20, and preferably to times larger than the latter width.

By width, what is meant is the dimension of a segment or of an arm in the (X, Y) plane, along an axis that is transverse, and for example orthogonal, to its longitudinal axis. The average width of a lateral segment 30 (tensioning arm) may then be an average of its transverse dimension, and preferably its orthogonal dimension, in an (X, Y) plane parallel to the plane of the carrier layer 2, along an axis transverse (preferably orthogonal) to a longitudinal axis of the lateral segment, between the central segment 20 and the peripheral portion 12. This longitudinal axis here coincides with a deformation axis. In the case of a central segment 20 subjected to multiaxial deformation, as in the example of FIG. 1B, the average width "a" of the central segment 20 may be an average of its transverse dimensions, in an (X, Y) plane parallel to the plane of the carrier layer 2, along axes passing through two radially opposite joints 32. A joint 32 is a zone in which two adjacent tensioning arms join. It may thus be a question of the diameter of a circle passing tangentially through the joints 32. It may also be a question, in the case of a central segment 20 of substantially rectangular shape, of the average of the distances separating two radially opposite joints, or of the average of the dimensions of the major axis and of the minor axis of an ellipse passing through the joints 32.

Furthermore, the areal dimension, in the (X, Y) plane, and in particular the width of each lateral segment 30, i.e. the transverse dimension substantially orthogonal to the longitudinal axis, may be chosen so that the lateral segment 30 experiences substantially no or little deformation. More precisely, the local average deformation decreases with distance from the stressed segment and becomes negligible at a distance larger than or equal to one or two times the dimensions of the stressed segment. The average deformation of the lateral segment 30, i.e. the deformation field integrated over the volume of the lateral segment 30, has a value lower than that of the stressed segment, or even is negligible with respect to the average deformation in the stressed segment. In the examples of FIGS. 1B and 1C, the lateral segments 30 have a trapezium shape so that their width continually increases with distance from the central segment 20. Other shapes are possible, for example a shape that sees the width of the lateral segments 30 abruptly increase with respect to the central segment 20 then a main zone of constant width.

The suspended membrane may be structured so as to control the value of the amplification of the tensile stress of the central segment 20, i.e. the tensile stress obtained during the production of the cavity 4 and therefore the suspension of the membrane. To this end, the dimensional parameters of the structured portion 11, for example the lengths and widths of the central segment 20 and of the tensioning arms 30, are preset. By way of example, in the case (not shown) of a rectangular central segment 20 of length A and of constant width a, and of rectangular tensioning arms 30 of length B/2-A/2 and of constant width b, the amplification factor f relating the final tensile stress $\sigma^f$ of the central segment 20 to the initial tensile stress $\sigma^i$ may be expressed by the following relationship formulated in the article by Süess et al. entitled *Analysis of enhanced light emission from highly strained germanium microbridges*, Nature Photon. 7, 466-472 (2013):

$$f = \frac{2L+B}{B}\left(1 + \frac{A}{B-A}\right) \Big/ \left(\frac{a}{b} + \frac{A}{B-A}\right)$$

where L is the length of the suspended structured portion 11. Thus, using the dimensional parameters of the structured portion 11 of the semiconductor layer 10, it is possible to control the value of the amplification of the tensile stress applied to the central segment 20 during the production of the cavity 4. The amplification factor may also be estimated by means of a numerical-simulation software package such as COMSOL Multiphysics.

Figure 2A:
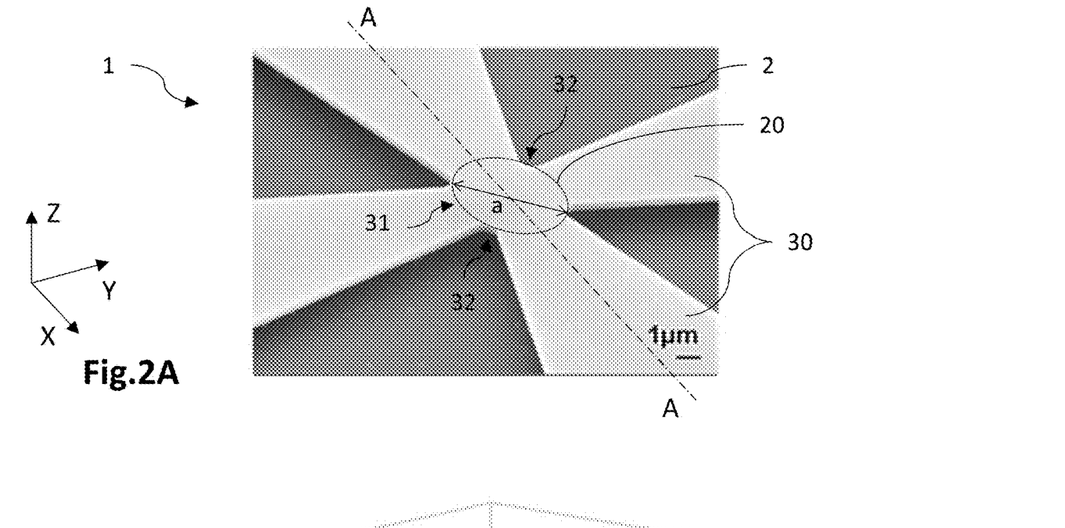
FIG. 2A is a microscope view taken by scanning electron microscope of a semiconductor structure similar to that illustrated in FIG. 1A.
Figure 2B:
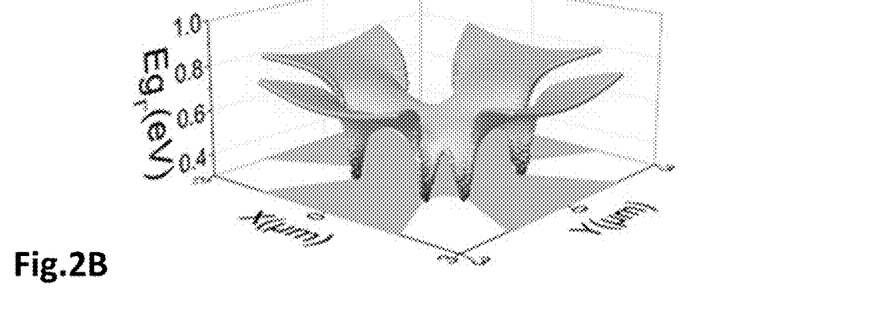
FIG. 2B illustrates the spatial distribution of the direct bandgap $E_{G,\Gamma}$ in the suspended membrane of the semiconductor structure illustrated in FIG. 2A.
Figure 2C:
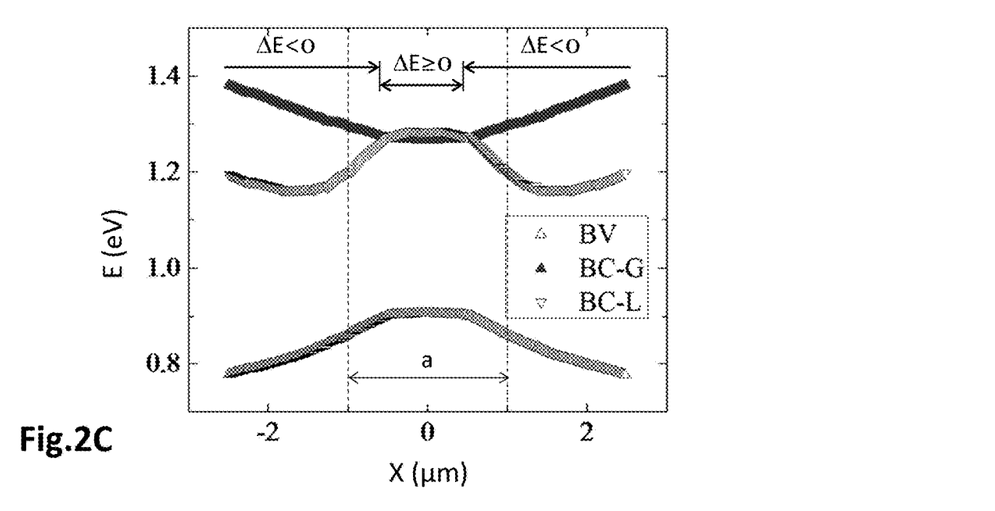
FIG. 2C illustrates the energy-band diagram of the suspended membrane along the axis A-A illustrated in FIG. 2A.

FIGS. 2A to 2C illustrate an example of the influence of biaxial stretching on the energy-band diagram of the suspended membrane of a semiconductor structure 1 similar to that illustrated in FIGS. 1A and 1B.

FIG. 2A is a microscope view taken by scanning electron microscope (SEM) of a suspended membrane in which the central segment 20 is stretched biaxially by four tensioning arms 30 that are opposite in pairs. This figure was taken from the publication of Gassenq et al. entitled *1.9% bi-axial tensile strain in the thick germanium suspended membranes fabricated in optical germanium-on-insulator substrates for laser applications*, Appl. Phys. Lett. 107, 191904 (2015). In this example, the suspended membrane is made of germanium and includes a central segment 20 of a circular shape of a diameter "a" of about 2 µm for a thickness of about 600 nm. The central segment 20 is subjected to an average tensile deformation of about 1.9% via two pairs of tensioning arms 30 that stretch the central segment 20 along deformation axes that are perpendicular to each other and here oriented along the axes X and Y.

FIG. 2B illustrates the spatial distribution of the direct bandgap $\Delta E_\Gamma$ in the central segment 20 and in a portion of the tensioning arms 30 of the suspended membrane illustrated in FIG. 2A. The direct bandgap $E_{G,\Gamma}$ is here defined as the difference between the energy of the conduction band of the direct valley $\Gamma$ and the energy of the valence band, i.e. $E_{G,\Gamma}=E_{BC,\Gamma}-E_{BV}$. The centre of the XY coordinate system is positioned at the centre of the central segment 20. FIG. 2C illustrates the energy-band diagram within the suspended membrane along the axis A-A parallel to the X-axis passing through the position Y=0. The band diagram was obtained using a tight-binding model, such as that described in the article by Niquet et al. entitled *Onsite matrix elements of the tight-binding Hamiltonian of a strained crystal: Application to silicon, germanium and their alloys*, Phys. Rev. B 79, 245201 (2009).

The inventors have observed that uniaxial stretching of the central segment 20 of the suspended membrane, such as the membrane illustrated in FIG. 1C, leads to a substantially uniform direct bandgap $E_{G,\Gamma}$ within the central segment 20, but that stretching along two or more axes leads to the formation of large nonuniformities in the energy-band structure of the central segment 20, in particular at the joints 32 between adjacent tensioning arms 30.

Specifically, whereas in the case of uniaxial stretching the direct bandgap $E_{G,\Gamma}$ is uniform within the central segment 20, it appears that this is no longer the case in the case of stretching along two or more axes, as FIGS. 2B and 2C show. The bandgap $E_{G,\Gamma}$ thus has a constant value of about 0.4 eV over a distance of about 1.5 µm centred on X=0 in the central segment 20 (which is bounded in FIG. 2C by the dashed lines), then values that increase greatly in particular in the direction of the tensioning arms 30 and minimum values at the joints 32 between adjacent tensioning arms 30 (see FIG. 2B). Thus, the biaxially deformed central segment 20 has a direct band structure $\Delta E > 0$ over the distance 1.5 µm centred on X=0, which then becomes indirect $\Delta E < 0$ in the direction of the tensioning arms 30.

Moreover, it appears that the spatial distribution of the indirect bandgap $E_{G,L}$ is dissimilar to that of $E_{G,\Gamma}$. Specifically, it has a constant value of about 0.4 eV over a distance of about 1 µm centred on X=0 in the central segment 20, that decreases then increases in the direction of the tensioning arms 30. This variation means that potential wells form in the positions X=±1.5 µm on either side of the central segment 20, and more particularly at the junctions 31 between the central segment 20 and the tensioning arms 30.

Thus, the central segment 20 has a direct band structure in a central zone in so far as the energy $E_{BC,\Gamma}$ of the conduction band of the direct valley $\Gamma$ is lower than that $E_{BC,L}$ of the indirect valley L, but has an indirect band structure in the direction of the tensioning arms 30. It also contains potential wells formed by the conduction band of the indirect valley L, this making it possible for electrons to couple between the direct valley $\Gamma$ and the indirect valley L and for electrons to become trapped in the potential wells.

These nonuniformities in the energy-band structure of the suspended membrane, which result from the deformation of the central segment 20 along at least two axes, reflect the presence of large variations in the direct bandgap $E_{G,\Gamma}$ and the presence of potential wells formed by the conduction band of the indirect valley L, this degrading the optical and/or electronic performance of the suspended membrane. Thus, in the case in particular of a coherent light source such as a laser diode the gain medium of which is formed by the central segment 20, these nonuniformities are liable to lead to a decrease in emission efficiency. In addition, photon-assisted radiative recombination of electrons located in the potential wells of the indirect valley L may occur with low probabilities. These undesired radiative transitions also degrade the optical and/or electronic properties of the central segment 20, for example leading to wavelength broadening in the photoluminescence spectrum of the laser diode.

Figure 3A:
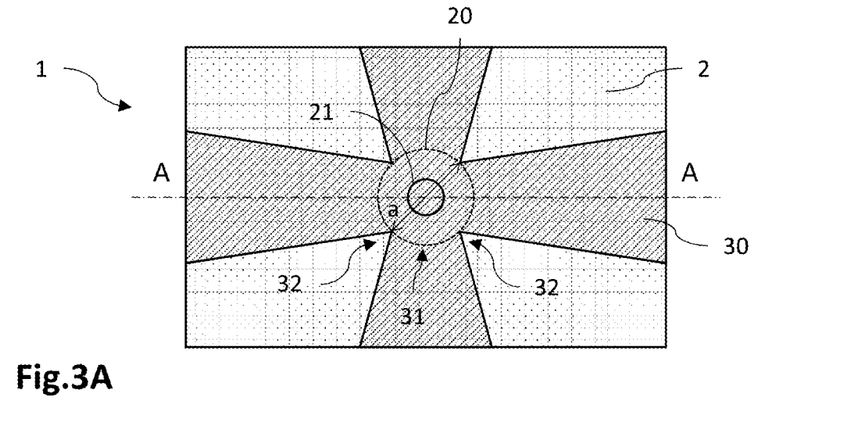
FIGS. 3A and 3B are schematic partial views, respectively from above and in longitudinal cross section, of a semiconductor structure according to an embodiment in which the suspended membrane includes at least one zone of thinned thickness.
Figure 3B:
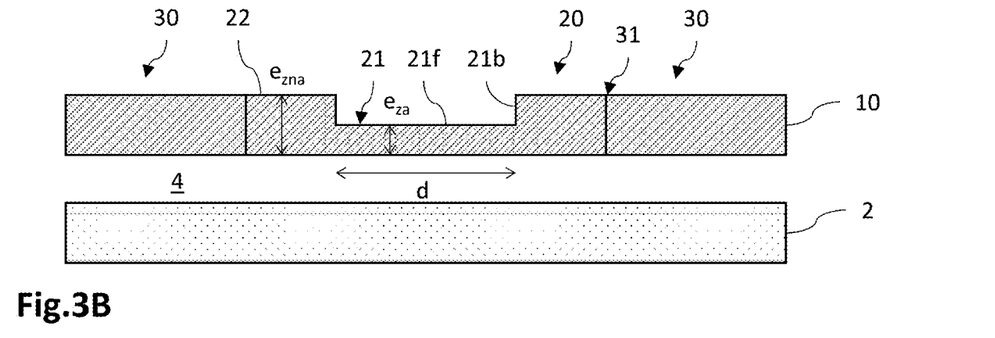
Figure 3C:
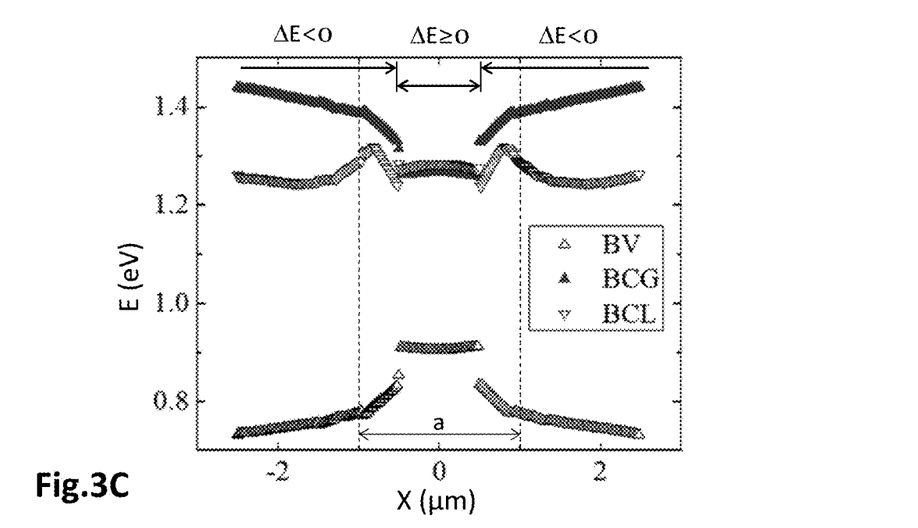
FIG. 3C illustrates the energy-band diagram of the suspended membrane along the axis A-A illustrated in FIG. 3A.

FIGS. 3A and 3B are schematic partial views, respectively from above and in longitudinal cross section along the axis A-A, of a suspended membrane according to an embodiment in which the central segment 20 is stretched biaxially by the lateral arms and includes at least one zone 21 of thinned thickness. FIG. 3C illustrates the energy-band diagram within the suspended membrane along the axis A-A parallel to the axis X passing through the position Y=0.

The inventors have observed that the optical and/or electronic properties of the suspended membrane may be improved by structuring the thickness of the central segment 20, i.e. by producing at least one zone 21 of the central segment 20 such that it has a thinned thickness. In the rest of the description, a zone 21 of thinned thickness is a zone, of the central segment 20, in which the average thickness is smaller than the average thickness of an un-thinned zone 22. The average thickness is here the average, for example the arithmetic average, of the local thicknesses of the central segment 20 in the zone in question. The average thickness $e_{za}$ of the thinned zone 21 is nonzero, and hence the thinned zone 21 cannot be likened to a through-aperture in the central segment 20. The average thickness $e_{za}$ is preferably comprised between 5% and 95% of the un-thinned thickness $e_{zna}$ of the semiconductor layer 10, and preferably comprised between 20% and 95%, and preferably higher than or equal to 50%. The un-thinned thickness $e_{zna}$ of the central segment 20 is substantially equal to the average thickness of the tensioning arms 30 and of the peripheral portion 12 of the semiconductor layer 10.

Thus, as illustrated in FIG. 3B, the central segment 20 contains at least one un-thinned zone 22 of average thickness $e_{zna}$ and one thinned zone 21 of average thickness $e_{za}$. The thinned zone 21 is at least partially, or even entirely, encircled by an un-thinned zone 22. The central segment 20 may include one or more thinned zones 21, depending on the optoelectronic or microelectronic applications of the semiconductor structure 1. The thinned zone 21 has, in the XY plane, a shape that is circular, oval, polygonal, etc., and preferably a circular shape in order to improve the spatial distribution of the mechanical stresses. It is formed by a bottom surface 21f that extends longitudinally in the XY plane and by a border 21b that transversely bounds the bottom surface 21f. The border 21b may extend along the Z-axis vertically or in an inclined manner. The average thickness $e_{za}$ of the thinned zone 21 is the average distance, along the Z-axis, between the lower face of the central segment 20 and the bottom surface 21f. The thinning, i.e. the ratio between the average thickness $e_z a$ and the average thickness $e_{zna}$, may be higher than or equal to 5%, or even to 10% or 20%, and preferably higher than or equal to 50%. The thinned zone 21 may have an areal extent, in the XY plane, larger than or equal to 5% or even to 10%, and preferably to 25%, of the area of the central segment 20. As defined above, the area of the central segment 20 may correspond to an ellipsoidal or circular area the perimeter of which passes through the joints 32 between adjacent tensioning arms 30. The area is ellipsoidal in particular when the central segment 20 is substantially rectangular, the major axis of the ellipse then being oriented parallel to the length of the central segment 20 and the minor axis parallel to its width.

FIG. 3C illustrates an example of an energy-band diagram for a central section 20 containing a thinned zone 21, along the X-axis and at the position Y=0. In this example, the suspended membrane is based on germanium and here more precisely made of germanium, and the central segment 20 has a substantially circular shape of a diameter "a" of about 2 µm, and includes a thinned zone 21 of 1 µm diameter. The central segment 20 has an average tensile deformation of about 2.3% in the thinned zone 21, higher than the tensile deformation of 1.9% mentioned above because of the presence of the thinned zone 21. The central segment 20 has an average thickness $e_{zna}$ of about 600 nm, and the average thickness $e_{za}$ of the thinned zone 21 is about 300 nm (thickness thinned by 50%).

As a result, the central segment 20 keeps a direct band structure around (X, Y)=(0, 0), and in particular in the thinned zone 21, in so far as the energy $E_{BC,\Gamma}$ of the conduction band of the direct valley $\Gamma$ is locally lower than that $E_{BC,L}$ of the indirect valley L. Moreover, the energy-band diagram of the suspended membrane contains potential barriers located around the thinned zone 21 and in particular at the junctions 31 between the central segment 20 and the tensioning arms 30, here at X=±0.75 µm, which allow the confinement of electrons in the central segment 20, and in particular in the thinned zone 21, to be improved, thus decreasing the risk that electrons will couple from the direct valley $\Gamma$ to the indirect valley L and therefore that electrons will be trapped in the potential wells described above. It will be understood that the presence of potential barriers around the thinned zone 21 therefore improves the optical and/or electronic properties of the suspended membrane. Thus, in the case where the central segment 20 forms the gain medium of a coherent light source such as a laser diode, emission efficiency may be greatly improved.

Figure 4:
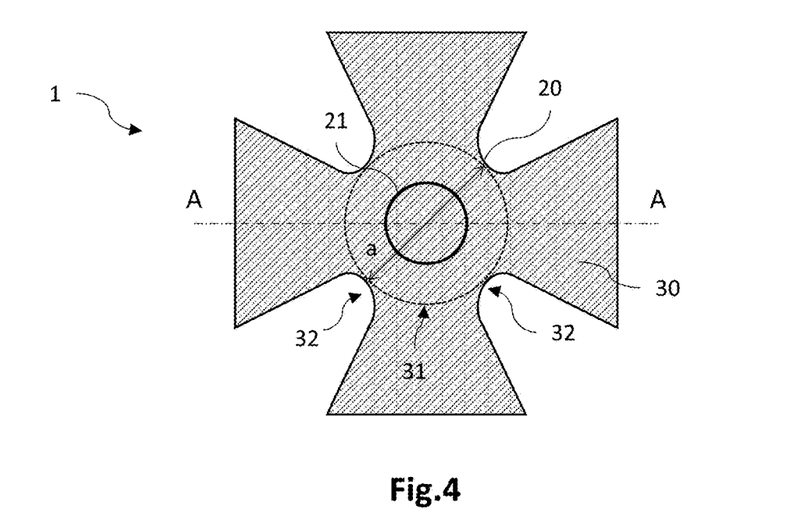
FIG. 4 is a schematic partial top view of a semiconductor structure according to one embodiment in which the suspended membrane includes at least one zone of thinned thickness.
Figure 5A:
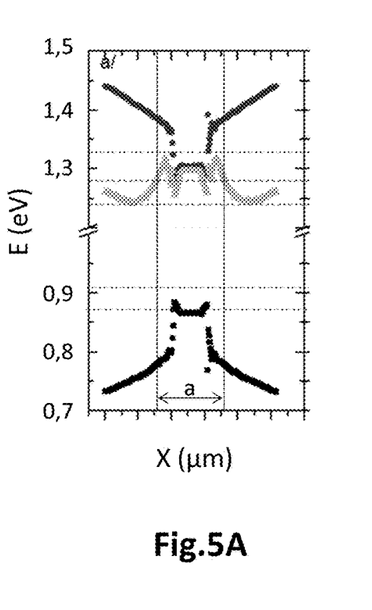
FIGS. 5A to 5C illustrate the energy-band diagrams of the suspended membrane along the axis A-A illustrated in FIG. 4, for various average thicknesses of the thinned zone.
Figure 5B:
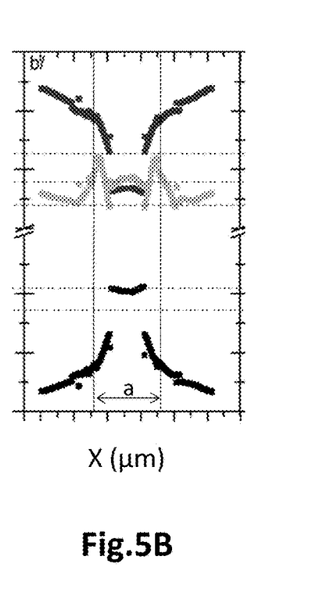
Figure 5C:
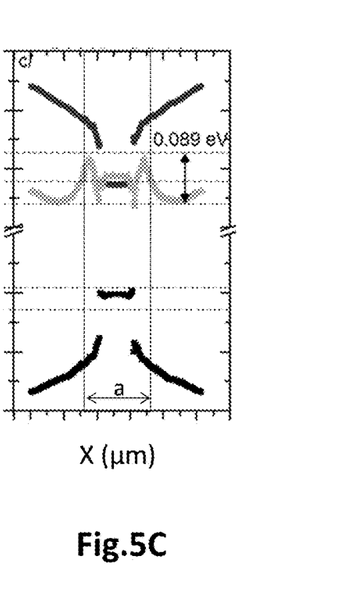

FIG. 4 and FIGS. 5A to 5C illustrate the influence of the value of the average thickness $e_{za}$ of the thinned zone 21 on the energy-band structure of the suspended membrane. FIG. 4 is a top view of the central segment 20 and of the lateral segments 30 of the suspended membrane in the case of a biaxial tension, and FIGS. 5A to 5C illustrate the energy-band diagram of the suspended membrane along the axis A-A parallel to the X-axis and passing through the position Y=0, for respective thinnings of 20%, of 50% and of 80%.

In this example, the crystalline semiconductor compound is based on germanium, and here is germanium, and the central segment 20 has a substantially circular area of a diameter "a" of about 2 µm, for an average un-thinned thickness $e_{zna}$ of about 600 nm and an average tensile deformation of about 2.3% in the thinned zone 21. It includes a thinned zone 21 of substantially circular shape of a diameter of about 1 µm, here positioned at equal distance from the tensioning arms 30. The thickness $e_{za}$ of the thinned zone 21 is equal to about 480 nm in the case of thinning of 20%, to about 300 nm for thinning of 50%, and to about 120 nm for thinning of 80%.

As illustrated in FIGS. 5A to 5C, the central segment 20 has a substantially direct band structure around (X, Y)=(0, 0), and in particular in the thinned zone 21, for each of the thinnings of 20%, 50% and 80%, in so far as the energy $E_{BC,\Gamma}$ of the conduction band of the direct valley $\Gamma$ is locally equal to or lower than that $E_{BC,L}$ of the indirect valley L. It is quasi-direct for the thinning of 20% in so far as the difference ΔE between $E_{BC,L}$ and $E_{BC,\Gamma}$ is negative, but remains low, i.e. lower than 0.01 eV, corresponding to kT for T=120 K. It is direct for the thinnings of 50% and 80% in so far as ΔE is positive.

Moreover, whatever the value of the thinning, the energy $E_{BC,L}$ of the conduction band of the indirect valley L contains potential barriers located around the thinned zone 21 and in particular at the junction 31 between the central segment 20 and the tensioning arms 30. The thinning may be about 50% or more, so as to increase the height of the potential barriers to about 89 meV, thus further improving the confinement of electrons in the central segment 20, and further decreasing the risk of coupling between the direct valley $\Gamma$ and the indirect valley L and therefore the risk that electrons will be trapped in the potential wells. Moreover, it will also be noted that the values of the ΔE between $E_{BC,L}$ and $E_{BC,\Gamma}$ decrease beyond a thinning of 50% because the tensile deformation increases at the centre of the membrane. Thus, the optical and/or electronic properties are improved in particular when the thinning is greater than or equal to 20%, and more so when it is greater than or equal to 50%.

Figure 6:
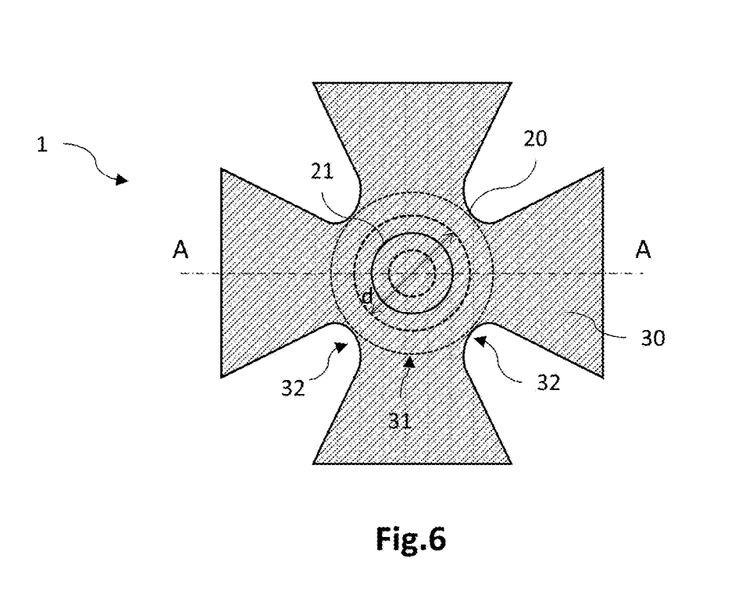
FIG. 6 is a schematic partial top view of a semiconductor structure according to an embodiment in which the suspended membrane includes at least one zone of thinned thickness for various thinned areas.
Figure 7A:
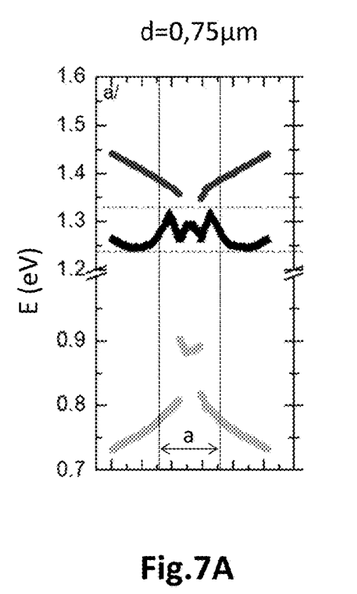
FIGS. 7A to 7C illustrate the energy-band diagrams of the suspended membrane along the axis A-A illustrated in FIG. 4, for various areas of the thinned zone.
Figure 7B:
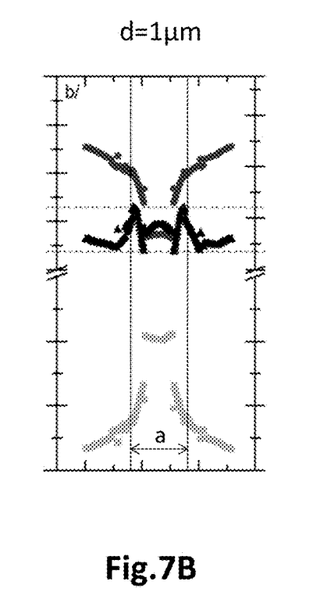
Figure 7C:
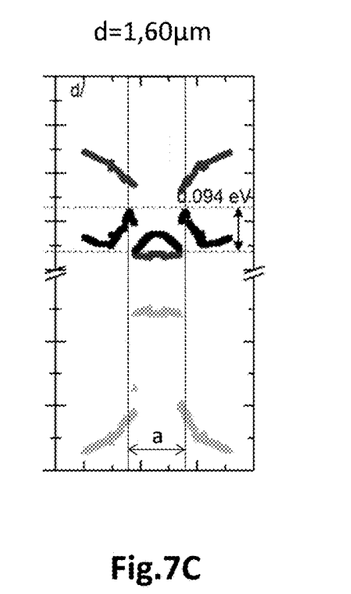

FIG. 6 and FIGS. 7A to 7C illustrate the influence of the area of the thinned zone 21 on the energy-band structure of the suspended membrane. FIG. 6 is a top view of the central segment 20 and of the lateral segments 30 of the suspended membrane in the case of a biaxial tension for various areas of thinned zone 21, and FIGS. 7A to 7C illustrate the energy-band diagram of the suspended membrane along the axis A-A parallel to the axis X passing through the position Y=0, for an area of the thinned zone 21 of 14%, 25% and 64% of the area of the central segment 20, respectively.

In this example, the crystalline semiconductor compound is germanium. The central segment 20 considered is of substantially circular area of a diameter "a" of about 2 µm and of average un-thinned thickness $e_{zna}$ of about 600 nm, the thinned zone 21 having a tensile deformation of about 2.3%. It includes a thinned zone 21 of substantially circular shape, here positioned at equal distance from the tensioning arms 30, of an average thickness $e_{za}$ of 300 nm (thinning of 50%). Three thinned zone 21 are described, of diameters "d" of 650 nm, 1 µm and 1.6 µm, corresponding to thinnings of 14%, 25% and 64%, respectively.

As FIGS. 7A to 7C illustrate, the larger the area of the thinned zone 21, the more the band structure therein is direct. Specifically, as the area of the thinned zone 21 increases, the difference ΔE between $E_{BC,L}$ and $E_{BC,\Gamma}$, in the thinned zone 21, turns positive and becomes larger. In addition, the energy $E_{BC,L}$ of the conduction band of the indirect valley L contains potential barriers around the thinned zone 21, said barriers in particular being located at the junction 31 between the central segment 20 and the tensioning arms 30. For a thinned zone 21 of area equal to at least 25% of the area of the central segment 20, the potential barriers have a height equal to about 94 meV, thus further improving the confinement of electrons in the thinned zone 21 of the central segment 20, and thereby further decreasing the risk that electrons will couple between the direct valley $\Gamma$ and the indirect valley L and therefore the risk that electrons will be trapped in the potential wells. Moreover, it also appears that the conduction band of the direct valley $\Gamma$ and the valence band have substantially constant values in the thinned zone 21 when the ratio of the areas is higher than or equal to 25%, this contributing to improving the optical and/or electronic properties of the suspended membrane. It will be understood that the optical and/or electronic properties are improved, in particular when the ratio of the area of the thinned zone 21 to the area of the central segment 20 is higher than or equal to 25%.

A process for fabricating the semiconductor structure 1 according to the embodiment illustrated in FIG. 2A will now be described. This process is similar to that described in patent application EP3151265. The semiconductor layer 10 is, in this example, made of monocrystalline germanium.

In a first step, a stack is produced, said stack comprising a germanium semiconductor layer 10 that is securely fastened to a carrier layer 2 by way of a sacrificial layer 3. The carrier layer 2 is, in this example, made of silicon and the sacrificial layer 3 is made of silicon oxide. The semiconductor layer 10 has a nonzero initial mechanical tensile-stress value $\sigma^i$.

To this end, the stack is here produced in the form of a GOI (for germanium-on-insulator) substrate, i.e. a germanium semiconductor layer 10 covering a sacrificial silicon-oxide layer 3 here resting on a silicon carrier layer 2. This stack is preferably produced by means of the process described in the publication of Reboud et al. entitled *Structural and optical properties of 200 mm germanium-on-insulator (GeOI) substrates for silicon photonics applications*, Proc. SPIE 9367, Silicon Photonics X, 936714 (Feb. 27, 2015) which in particular employs the Smart Cut™ technology.

Alternatively, the stack may be produced by epitaxial growth of a germanium semiconductor layer 10 on a substrate, the germanium semiconductor layer 10 then being covered with a silicon-oxide layer. This stack is then molecularly bonded to a second stack comprising a silicon layer covered with a silicon-oxide layer, the bonding being achieved by bringing the silicon-oxide layers into mutual contact. Next, the substrate is completely removed, for example by grinding, so as to thus obtain a germanium semiconductor layer 10 bonded to a silicon carrier layer 2 by a sacrificial silicon-oxide layer 3. This approach is in particular described in the publication of Jan et al. entitled *Tensile-strained germanium-on-insulator substrate for silicon-compatible optoelectronics*, Opt. Mater. Express 1, 1121-1126 (2011).

Production of the semiconductor layer 10 of desired thickness $e_{zna}$ by means of the process described in the publication of Reboud et al. 2015 is particularly advantageous in so far as the crystalline quality of the semiconductor layer 10 is then particularly high and substantially uniform throughout the thickness of the layer. By way of example, the dislocation density may be lower than 107 $cm^{-2}$ throughout the thickness of the layer, and in particular at the interface with the sacrificial layer 3.

In a second step, the semiconductor layer to is structured so as to form the structured portion 11 and the peripheral portion 12. The structured portion 11 includes a central segment 20 that experiences a tensile deformation along at least two deformation axes defined by the tensioning arms 30. The structured portion 11 is produced using conventional steps of lithography then of etching the semiconductor layer 10. The structured portion 11 still experiences, in this step, the initial tensile stress $\sigma_i$.

In a third step, at least one zone 21 of thinned thickness is produced, which zone is located in the central segment 20. A plurality of thinned zones 21 may be formed depending on the microelectronic or optoelectronic applications of the semiconductor structure 1. The thinned zone 21 is produced using conventional lithography and etching steps. It has a shape in the XY plane that also depends on the targeted applications. Its thickness is preferably comprised between 5% and 95% of the un-thinned thickness of the semiconductor layer 10, and preferably comprised between 20% and 95%, or even preferably comprised between 50% and 80%. To facilitate the partial etching, the semiconductor layer 10 may comprise a stack of sublayers made of different materials, for example germanium-based materials, one of which forms an etch-stop layer. By way of example, the etch-stop sublayer may be made from germanium-tin GeSn and the locally etched upper sublayer made of germanium. The germanium will be selectively etched in carbon tetrachloride ($CF_4$) with etching stopped on the germanium-tin. Moreover, during the production of the semiconductor layer 10, doped zones may be formed in the tensioning arms 30 facing one another, and quantum wells may be formed in the central segment 20.

In a fourth step, a cavity 4 is produced under the structured portion 11 of the semiconductor layer to thereby freeing a surface of the carrier layer 2 located facing the structured portion 11, so as to suspend the structured portion 11 above the carrier layer 2. The tensile stresses present in the lateral segments 30 relax, so that the central segment 20 then experiences a tensile stress of a final value $\sigma^f$ higher than the initial value a. The lateral segments 30 then play the role of tensioning arms 30. The cavity 4 may be produced by wet etching of the sacrificial layer 3, the latter being made accessible via apertures obtained during the structuring of the semiconductor layer 10. The wet etch may use here vapour-phase hydrofluoric acid (also called HF).

A suspended-membrane semiconductor structure 1 is thus obtained the central segment 20 of which sees the tension under which it is placed increased by the tensioning arms 30 during the suspension. The presence of at least one zone 21 of thinned thickness in the central segment 20 allows the optical and/or electronic properties of the suspended membrane to be improved, in so far as the band diagram reflects the presence of potential barriers located around the thinned zone 21 and in particular between the central segment 20 and the tensioning arms 30, these potential barriers improving the confinement of electrons in the thinned zone 21 of the central segment 20 and decreasing the risk that electrons will be trapped in the potential wells formed by the conduction band of the indirect valley L.

As described in patent application EP3151265, in order to ensure that the suspension of the membrane allows a direct energy-band structure to be obtained in the central segment 20 and in particular in the one or more thinned zones 21, a minimum tensile-stress value $\sigma^{min}$ from which the thinned zone 21, of given thickness $e_{za}$ and of given area, will have a direct band structure may first be estimated. The stack is then produced so that the semiconductor layer 10 has an initial value $\sigma^i$ lower than the minimum value $\sigma^{min}$, then the central segment 20 and the tensioning arms 30 are structured so that, after suspension of the membrane, the central segment 20 has a final tensile-stress value $\sigma^f$ higher than or equal to the minimum value $\sigma^{min}$, and therefore a direct energy-band structure in the thinned zone or zones 21 of the central segment 20. The structuring of the structured portion 11 may be carried out on the basis of the relationship given in the aforementioned article by Süess 2013, or even on the basis of an estimation carried out by means of a numerical simulation software package.

An additional step may be carried out in which the structured portion 11, and more precisely the central segment 20 and at least one portion of the tensioning arms 30, are brought into contact with the free surface of the carrier layer 2. To this end, the structured portion 11 may be submerged in a liquid solution, for example alcohol or acidified deionized water (pH close to 2), then the liquid evaporated. In the evaporation phase, the suspended structured portion 11 naturally makes contact with the free surface of the carrier layer 2. It is then possible to remove a segment of the tensioning arms 30 that is distant with respect to the central segment 20 by etching, so as to separate or singulate the structured portion 11 with respect to the peripheral portion 12.

Figure 8A:
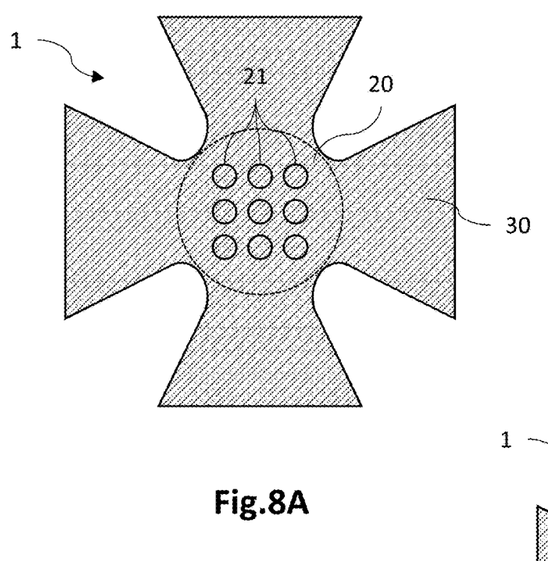
FIGS. 8A to 8C are schematic partial top views of various variants of the semiconductor structure according to one embodiment including a photonic-crystal-containing optical cavity (FIG. 8A); a ringed optical cavity (FIG. 8B); and an optical cavity with Bragg mirrors located at the ends of rectilinear thinned zones (FIG. 8C).
Figure 8B:
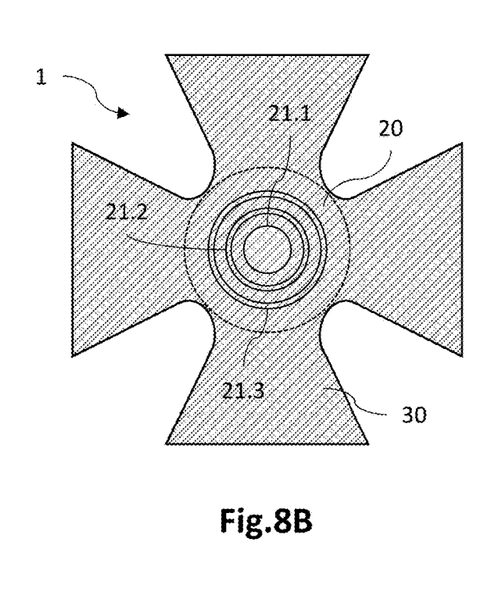
Figure 8C:
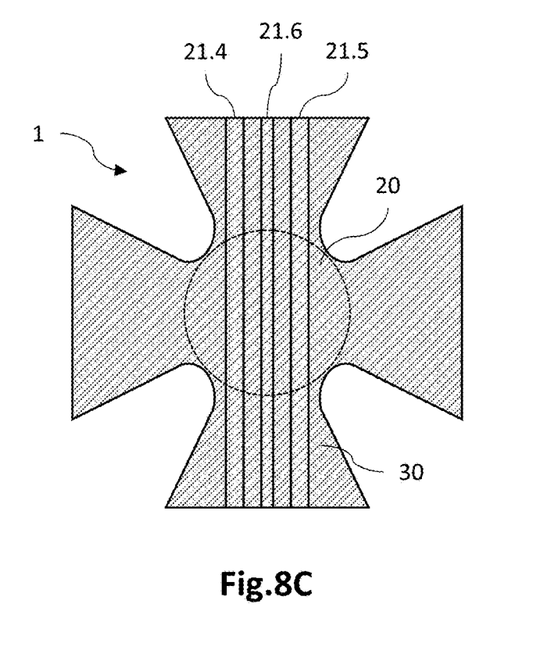

FIGS. 8A to 8C are schematic partial top views of various variants of a suspended membrane of a semiconductor structure 1 according to one embodiment, in which variants the central segment 20 is stretched biaxially by tensioning arms 30 of the suspended membrane. Such a semiconductor structure 1 may be applied in the context of an optoelectronic device for emitting coherent light, such as a laser diode. The central segment 20, and in particular the one or more thinned zones 21, form the gain medium of the laser diode. In these examples, two facing tensioning arms 30 may be doped n+ and p+, respectively, in order thus to ensure an electrical injection of charge carriers into the central segment 20.

As illustrated in FIG. 8A, the central segment 20 may include a plurality of thinned zones 21 that are separate from one another and spatially distributed periodically to form photonic crystals. The thinned zones 21 here have a circular shape in the XY plane, and the set of thinned zones 21 is centred on the centre X,Y=(0,0) of the central segment 20. The photonic crystals may have various geometries, for example a triangular geometry, a square geometry, a rectangular geometry, a hexagonal geometry, etc. The period and dimensions of the thinned zones 21 may be chosen so as to obtain both a direct band structure in the thinned zones 21 and a good overlap of the optical mode with the gain medium that the central segment 20 forms. Because of the presence of the thinned zones 21, potential barriers are present that improve the optical and/or electronic properties of the laser diode. As a variant, or in addition, the thinned zones 21 may also be present on the tensioning arms 30. The reflectance may be different in the direction of any given arm. Thus, one tensioning arm may include fewer thinned zones 21 than the other arms, thus decreasing the reflectance and permitting a transmission of some of the optical mode present in the central segment 20 in the direction of the tensioning arm in question.

FIG. 8B illustrates another variant in which the optical cavity is formed by a plurality of ring-shaped thinned zones 21.2, 21.3 that each encircle a central thinned zone 21.1. In this example, a central thinned zone 21.1 is present in the middle of the central segment 20, which is encircled by at least two ring-shaped thinned zones 21.2, 21.3. A ring-shaped thinned zone 21.2, 21.3 is a layer segment the thickness of which is at least partially etched and that extends longitudinally, here circularly, around a central point. The thinned zones 21.1, 21.2, 21.3 may have a constant average thickness $e_{za}$ along the longitudinal axis. The average thicknesses of the various thinned zones 21.1, 21.2, 21.3 may be identical or different from one another.

FIG. 8C illustrates another variant in which the optical cavity is longitudinal and bounded by two Bragg mirrors (not shown) that are formed in two facing tensioning arms 30 and located at the ends of thinned zones 21.4 and 21.5 that extend into these tensioning arms. Thus, in this example, two lateral thinned zones 21.4, 21.5 extend rectilinearly over the central segment 20 and the two opposite tensioning arms 30. The average thickness of the two thinned zones 21.4, 21.5 and their spacing are chosen depending on the desired optical properties. Thus, an optical mode may be guided longitudinally by virtue of the thinned zones 21.4 and 21.5 to the two Bragg mirrors in order to form an optical cavity. It may be advantageous to position a central thinned zone 21.6 in the optical cavity, here placed between the two thinned zones 21.4, 21.5, so that a maximum of the intensity of the guided optical mode overlaps with a zone of the central segment 20, formed by the central thinned zone 21.6, which has a direct band structure.

Particular embodiments have just been described. Various variants and modifications will appear obvious to those skilled in the art.

Thus, the tensioning arms 30 may be of different shape from one another, but it is preferable for them to be of identical shape. The tensile deformation of the central segment 20 is at least biaxial and it includes, for this reason, four tensioning arms 30 that are opposite in pairs. The deformation may as a variant be triaxial, or more than triaxial, and may include, in the triaxial case, three tensioning arms that are opposite one another with respect to the central segment 20 or six tensioning arms 30 that are opposite in pairs. The various tensioning arms 30o are preferably distributed uniformly around the central segment 20.

The invention claimed is:

1. A semiconductor structure, including a semiconductor layer made of a crystalline semiconductor compound, a portion of the semiconductor layer of which forms a suspended membrane above a carrier layer, the suspended membrane comprising:
   a central segment, which is tensilely stressed in a plane parallel to the carrier layer; and
   a plurality of lateral segments, which are opposite one another with respect to the central segment, and arranged so as to keep the central segment suspended and tensilely stressed along at least two separate deformation axes, the lateral segments having an average width larger than an average width of the central segment, the average width being an average dimension, in a plane parallel to the plane of the carrier layer along an axis that is transverse to said deformation axes;
   wherein the central segment comprises at least one zone of thinned thickness, and
   wherein the suspended membrane has a direct energy-band structure at least in said thinned zone.

2. The semiconductor structure according to claim 1, wherein the thickness of the thinned zone is thinned by 20% or more.

3. The semiconductor structure according to claim 1, wherein a ratio between an area of the thinned zone and an area of the central segment is higher than or equal to 14%.

4. The semiconductor structure according to claim 1, wherein the crystalline semiconductor compound is based on germanium.

5. The semiconductor structure according to claim 1, wherein the central segment includes a plurality of thinned zones that are separate from one another and arranged, with respect to one another, so as to form an optical cavity.

6. An optoelectronic device for emitting coherent light, including a semiconductor structure according to claim 5, the central segment being suitable for forming a gain medium of the optoelectronic device.

7. The optoelectronic device according to claim 6, wherein the central segment comprises a plurality of thinned zones that are separate from one another and placed beside one another periodically so as to form photonic crystals.

8. The optoelectronic device according to claim 6, wherein the central segment comprises a first thinned zone encircled by a plurality of thinned zones that are separate from one another and that each have a ring shape encircling the first thinned zone, so as to form a ringed optical cavity.

9. The optoelectronic device according to claim 6, wherein the central segment comprises at least two thinned zones taking a form of strips that are parallel to one another and that extend longitudinally over the central segment and over two lateral segments that are placed opposite each other with respect to the central segment.

10. A process for fabricating a semiconductor structure according to claim 1, comprising the following steps:
   i) producing a stack which comprises the semiconductor layer covering a sacrificial layer that is placed on the carrier layer, the semiconductor layer having an initial non-zero tensile-stress value;
   ii) structuring the semiconductor layer so as to form a structured portion and a peripheral portion;
   iii) producing at least one zone of thinned thickness in the central segment; and
   iv) producing a cavity under the structured portion and thereby freeing a surface of the carrier layer located facing the structured portion, the central segment then being tensilely stressed with a final value higher than the initial value.

11. The fabricating process according to claim 10, including at least the following steps:
   prior to step i of producing the stack, estimating a minimum tensile-stress value from which the thinned zone of the central segment has a direct energy-band structure for a given value of average thickness of the thinned zone;
   in step i, producing the stack so that the semiconductor layer has an initial value lower than the minimum value; and
   prior to the structuring step ii, defining the structuring so that, after step iv of producing the cavity, the thinned zone of the central section has a final tensile-stress value higher than or equal to the minimum value, and therefore a direct energy-band structure.

12. The semiconductor structure according to claim 1, wherein the thickness of the thinned zone is thinned by 50% or more.

13. The semiconductor structure according to claim 1, wherein a ratio between an area of the thinned zone and an area of the central segment is higher than or equal to 25%.

* * * * *